US006378112B1

(12) United States Patent
Martin et al.

(10) Patent No.: US 6,378,112 B1
(45) Date of Patent: Apr. 23, 2002

(54) VERIFICATION OF DESIGN BLOCKS AND METHOD OF EQUIVALENCE CHECKING OF MULTIPLE DESIGN VIEWS

(75) Inventors: Andrew K. Martin; Narayanan Krishamurthy; Magdy S. Abadir; Li-Chung Wang, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/332,817

(22) Filed: Jun. 14, 1999

(51) Int. Cl.[7] .............................................. G06F 17/50
(52) U.S. Cl. ......................................................... 716/5
(58) Field of Search ..................... 716/4, 5, 6

(56) References Cited

U.S. PATENT DOCUMENTS 5,493,508 A * 2/1996 Dangelo ........................ 716/5
6,061,293 A * 5/2000 Miller ..................... 365/230.08
6,163,876 A * 12/2000 Ashar ............................ 716/5

OTHER PUBLICATIONS

Velev, M.N. et al., "Incorporating timing constraints in the efficient memory for symbolic ternary simulation". Oct. 5, 1998. IEEE pp. 400–406.*
Vakilotojar, V. et al., "RTL verification of timed asynchronous and heterogeneous systems using symbolic model checking". Jan. 28, 1997. IEEE pp. 181–188.*
Hu, A.J., "Formal Hardware verification with BDDs: an introduction". Aug. 20, 1997. IEEE. pp. 677–682.*

* cited by examiner

Primary Examiner—John F. Niebling
Assistant Examiner—Stacy A Whitmore
(74) Attorney, Agent, or Firm—Robert L. King

(57) ABSTRACT

A method and system for comparing design block views comprising receiving a first design block view, receiving a second design block view, and comparing the first design block view with the second design block view to determine whether the first design block view is logically equivalent to the second design block view, the second design block view contains data representing self-timed circuits or a memory array.

24 Claims, 5 Drawing Sheets

VERIFICATION OF DESIGN BLOCKS AND METHOD OF EQUIVALENCE CHECKING OF MULTIPLE DESIGN VIEWS

FIELD OF THE INVENTION

This invention relates generally to verification and equivalence checking for design blocks, such as design blocks for semiconductor devices, including microprocessors and related elements.

BACKGROUND OF THE INVENTION

For designs of semiconductor devices, such as microprocessors, conventional methods of performing design simulation and verification are to model the design with a high level view, such as a RTL description and a separate low level view, such as a transistor schematic or net list. The high level view has the advantage of fast simulation and functional verification. However, simulation of the high level model does not guarantee correctness of a physical semiconductor device made in accordance with the corresponding transistor schematic. To provide improved quality testing, the transistor schematic view has been simulated. However, due to the very large number of transistor elements in commercial designs, full chip simulation is not economically practical. Even simulation of transistor schematic designs for a portion of the chip, full error detection coverage using conventional simulation is not available.

Another approach for verification of designs for certain classes of circuits, typically static combinational circuits, is known as formal equivalence checking. This approach uses mathematical models of stable outputs of networks of combinational logic. While this approach is useful for certain types of circuits, the technique is generally not applicable for circuits that have self-timing elements, such as memory arrays. Since memory arrays are often a significant portion of a design for a semiconductor device, it would be desirable to perform formal equivalence checking on memory arrays. The conventional methods do not address transient outputs within clock phases that are necessary for self timed circuits.

Accordingly, there is a need for an improved method and system to verify design blocks with multiple views.

DESCRIPTION OF THE DRAWINGS

Figure 1:
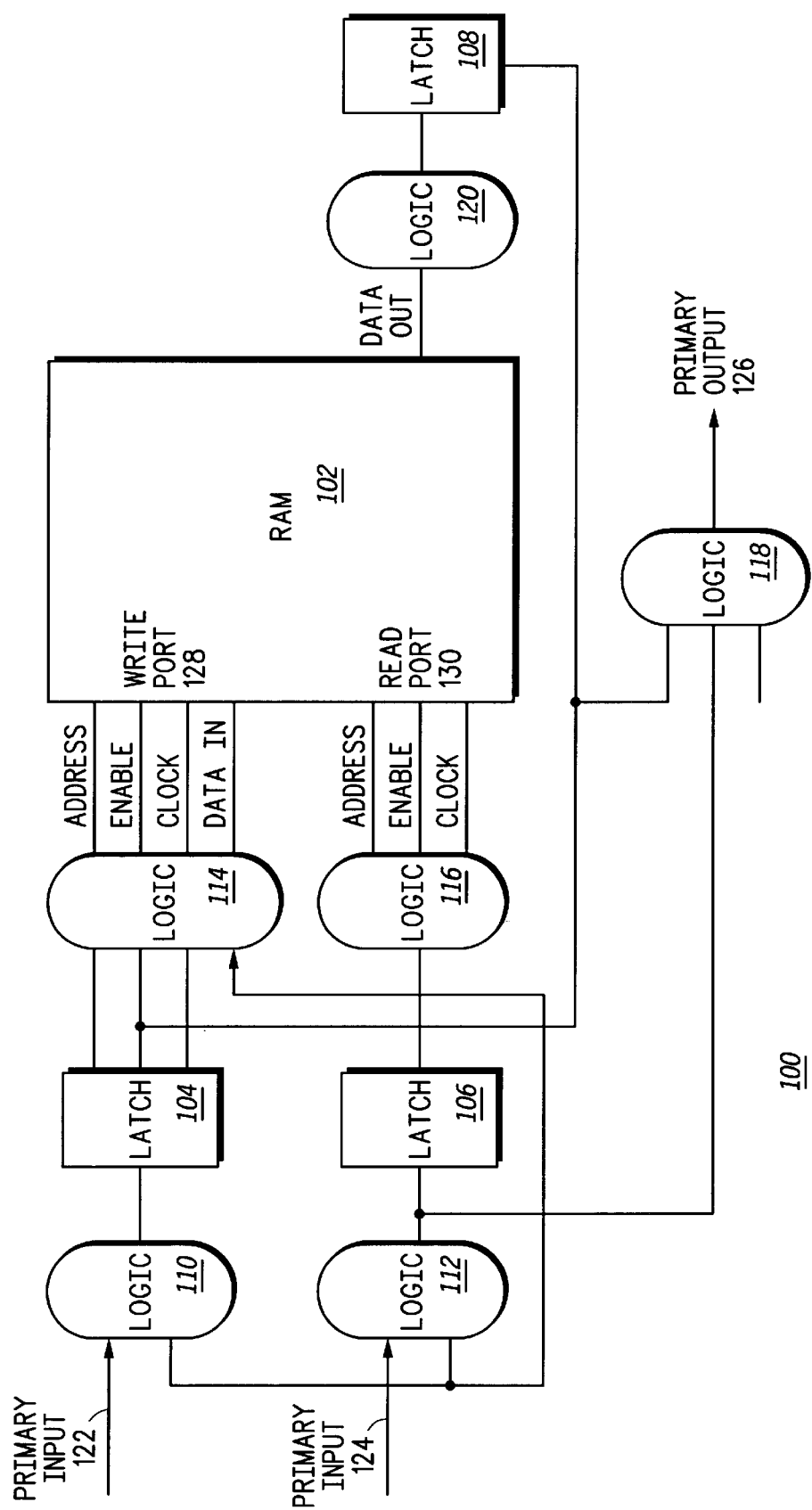
FIG. 1 is a block diagram that illustrates an exemplary design block for a portion of a digital circuit, such as found in a microprocessor.

FIG. 1 discloses a design block 100 for a portion of a circuit for a system, such as a microprocessor. The design block 100 includes a memory 102, such as an embedded random access memory, various latches 104, 106, 108 and various logic blocks 110, 112, 114, 116, 118, and 120. The latches may either be single registers or banks of multiple latches. The logic blocks are typically static combinational logic or dynamic circuits. The logic elements 110, 112 receive primary inputs 122, 124, and a primary output 126 is produced from logic module 118 that is fed by logic module 112 and by latch 108. The logic blocks 114 and 116 provide address and control signals to write port 128 and read port 130, respectively. The above design block is disclosed as an illustrative framework for discussing various methods and techniques for comparing and verifying different design views.

Figure 2:
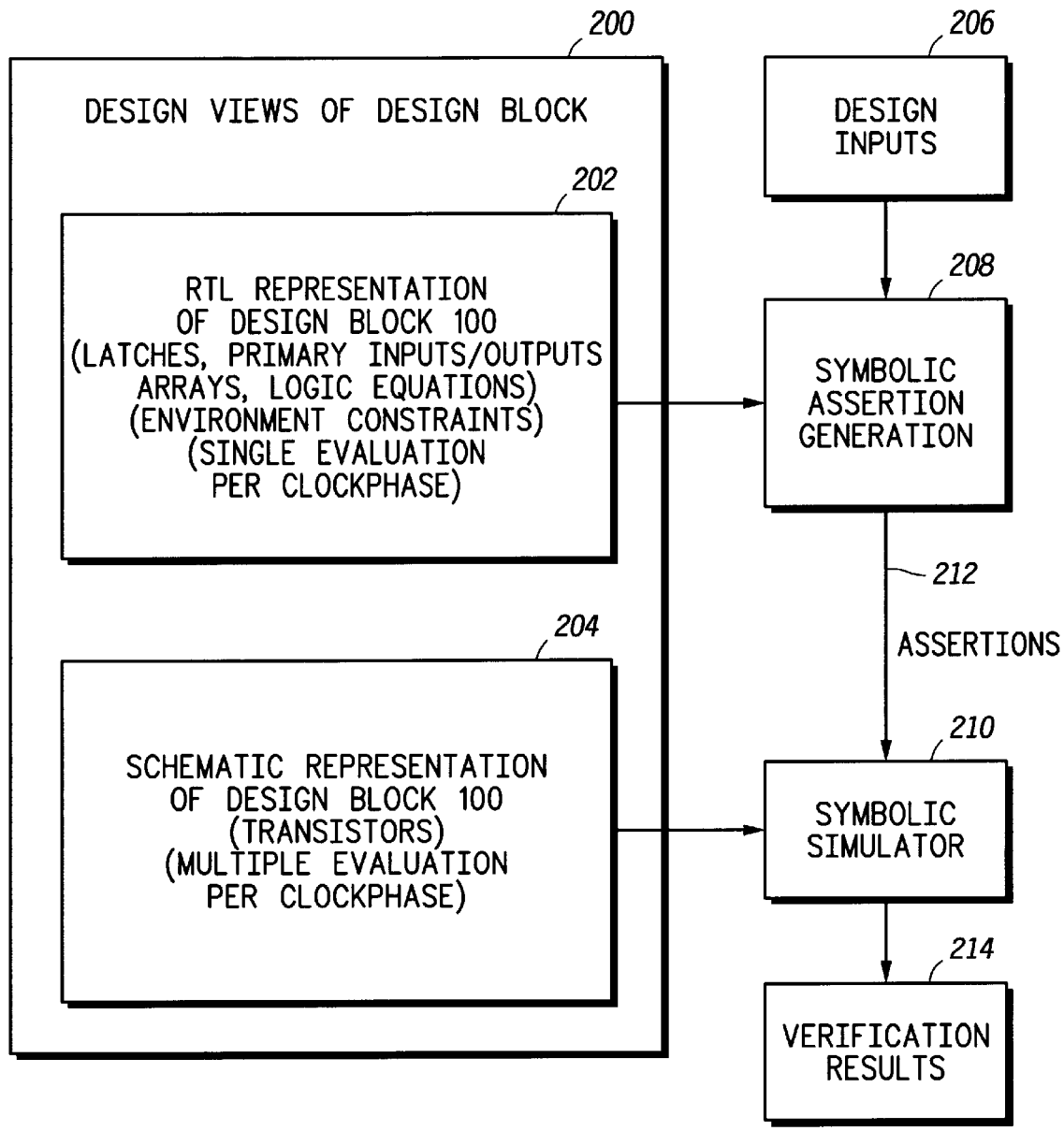
FIG. 2 is a flow diagram that illustrates a general method of comparing different views of the design block of FIG. 1.

FIG. 2 is a flow diagram that illustrates a general method of comparing different views of the design block of FIG. 1. Design views 200 of the design block 100 include a first view of the design, such as a register transfer level representation 202, and a second view of the design block 100, such as a schematic representation 204. The first view 202 includes data representing latches, such as transparent latches, primary inputs, primary outputs, memory arrays, and digital logic equations, as well as optionally environmental constraints. The first view 202 may be a gate level representation of a particular design. The first view 202 allows for simulation with a single evaluation for each phase of a main clock, such as cycle based simulation. The main clock may be a clock signal that drives execution of instructions by a microprocessor.

The second view 204 may include data that represents a large number of interconnected transistor elements, referred to as a transistor representation. Alternatively, the second view 204 could be a higher level view of a design, such as a gate level representation. The data representing either the first view 202 or the second view 204 may be in the form of a netlist or any form of data stored in a computer database. In a particular embodiment of view 204, an event-based simulator may evoke multiple evaluations for each phase of the main clock. For example, in a particular simulation application, there may be a range of from two to hundreds of evaluations for a particular main clock phase. Multiple evaluations are particularly useful in simulating self-timed circuits, such as static memories.

The first view 202 is input to a symbolic assertion generator 208 that also receives design inputs 206. The design inputs 206 include clock phase-based timing types for primary inputs, latches, primary outputs, and bit cells of memory arrays. Phase-based timing type is used to indicate for a particular circuit element, logic states (e.g. logic high, low, new or previous data value) for each phase of the main clock. For example, a phase-based timing type of a clock signal could be represented by a high logic state for phase 1 of the main clock and a low logic state for phase 2 of the main clock where the main clock has only two phases. Another type could be defined to have a new data during phase 1 and retain a previous data value during phase 2 of the main clock. It will be appreciated that many additional types may be defined based on particular circuits being simulated or on various design applications. The design inputs 206 further includes mapping information that relates timing and location of circuit elements from the first view 202 and the second view 204.

The symbolic assertion generation module 208 produces assertions 212 from the first view 202 and the design inputs 206. The symbolic assertions consist of one or more antecedents describing symbolic stimulus to be applied to the circuit and one or more consequents describing expected results. Each antecedent and consequent consists of a time interval, the name of a circuit node from the second view 204, a symbolic guard, and a symbolic value or function. The symbolic guards, values or functions may be Boolean constants, or Boolean functions, such as binary decision diagrams (BDD). The assertions 212 are used to provide stimulus and expected results for symbolic simulation. The assertions 212 are fed into a symbolic simulator 210 that also receives data for the second view 204. An example of a symbolic simulator is described in "Voss—A Formal Hardware Verification System: User's Guide", Carl-Johan H. Seger, Technical Report 93-45, Dept. of Computer Science, University of British Columbia, 1993. The symbolic simulator 210 executes a computer simulation on the second schematic view 204 of the design block 100 with the antecedents of the assertions 212 providing stimulants and the consequents of the assertions 212 providing expected results. The symbolic simulation may include use of scalar values as a substitute for a set or subset of symbols. The output of such a simulation is a set of difference symbolic functions, such as BDDs that thereby produce verification results 214. The difference symbolic functions characterize the difference between the expected values and the data values produced during the simulation. Where the symbolic functions indicate no difference, the first view 202 and the second view 204 are logically equivalent. Thus, the assertions are used to check logical equivalence between the first view 202 and the second view 204. The symbolic assertion generation module may be implemented as a computer program that executes on a computer, such as a personal computer or engineering work station.

Figure 3:
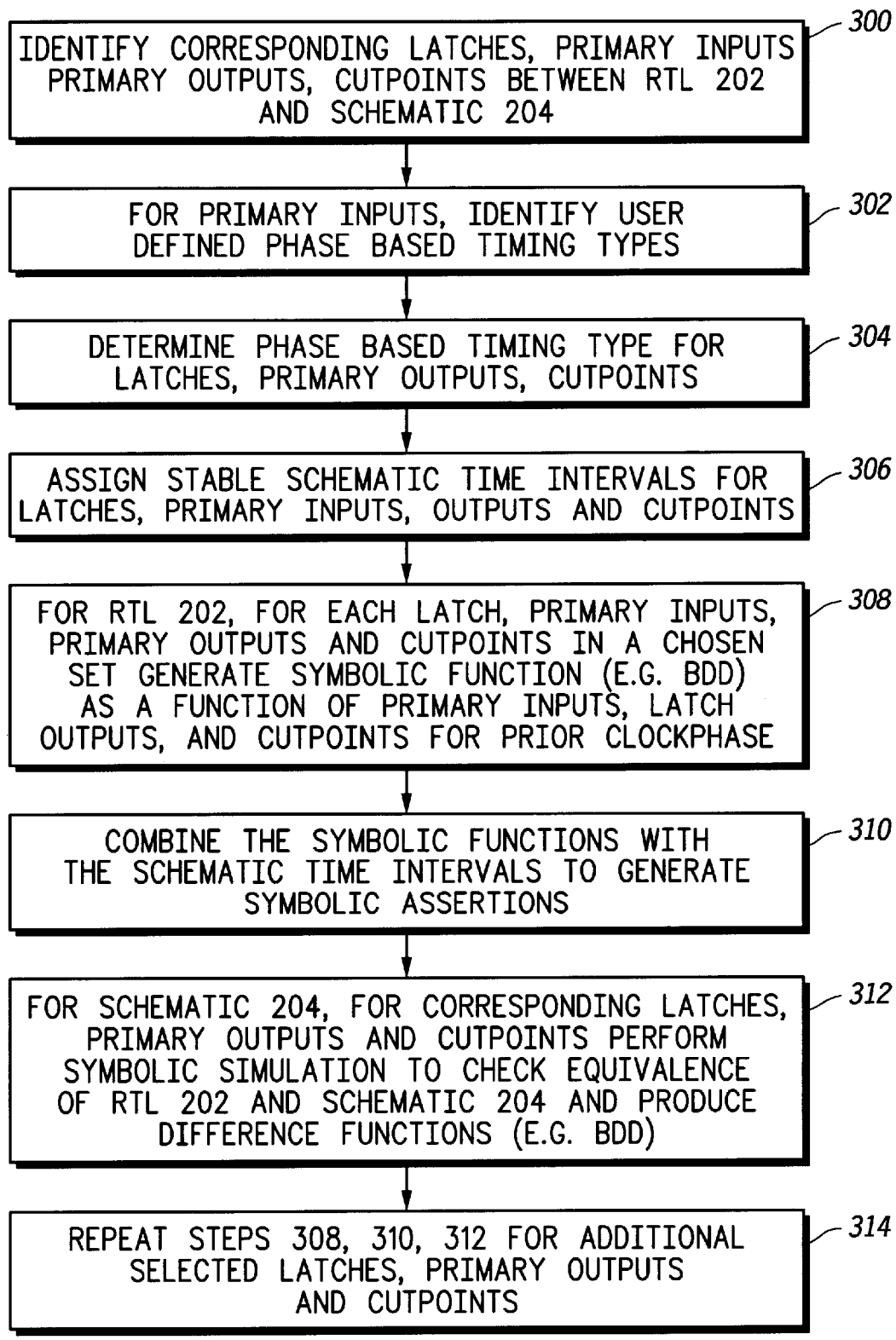
FIG. 3 is a flow diagram that illustrates a particular method of comparing different views of a portion of the design block of FIG. 1 without a memory array.

Referring to FIG. 3, a flow diagram is disclosed that illustrates a particular method of comparing different views of a portion of the design block 100, but without the memory array. The method includes identifying corresponding latches, primary inputs, primary outputs, and cutpoints between the first view 202 and the second view 204, at step 300. Phase-based timing types are then identified for each primary input, at 302, and for each latch, primary output and cutpoint, at 304. Stable schematic time intervals for primary inputs, primary outputs, latches and cutpoints are assigned, at 306. Data representing the schematic time intervals may be implemented as pairs of data values and time point for each change of data values for a given main clock cycle that may include multiples clock phases. For each element in the first view 202, a corresponding digital waveform from the second view 204 is defined, as further described in FIG. 6 and FIG. 7. The digital waveform represents a signal produced by an element in the schematic view 204 for the corresponding element and signal in the first view 202.

For the first view 202 and for each latch, primary output, and cutpoint in a chosen set, a symbolic function, such as a BDD function, is generated. The symbolic function represents the value of a particular element at a given clock phase as a function of the values of primary inputs, latch outputs, and cutpoints for a prior clock phase. The symbolic functions are combined with the schematic time intervals to generate symbolic assertions, at 310. For each such symbolic function a consequent is generated where the circuit node name of the consequent is the name of the circuit node from the second view 204 that was identified at step 300 as corresponding to the circuit element from the first view 202 whose value the symbolic function represents. The time intervals and values of the consequent are those that are given by the schematic time intervals identified in step 306 for the symbolic function, and the clock phase that the symbolic function represents.

For each circuit element from the first view 202 whose value in a prior clock phase is represented by a variable in the support of the symbolic function that was generated in step 310, an antecedent is generated. The circuit node name of the antecedent is the name of the circuit node from the second view 204 that was identified at step 300 as corresponding to the circuit element from the first view 202 whose value the variable represents. The time intervals and values of the antecedent are those that are given by the schematic time intervals identified in step 306 for the variable, and the clock phase that the variable represents.

For the second view 204, for corresponding latches, primary outputs, and cutpoints, symbolic simulation is performed to check equivalence of the first view 202 with respect to the second view 204 and to produce difference symbolic functions, such as a difference BDD functions. The above steps 308, 310, 312, and 314 may optionally be repeated for additional selected latches, cutpoints and primary outputs for the design block being verified until all desired elements have been verified.

Figure 4:
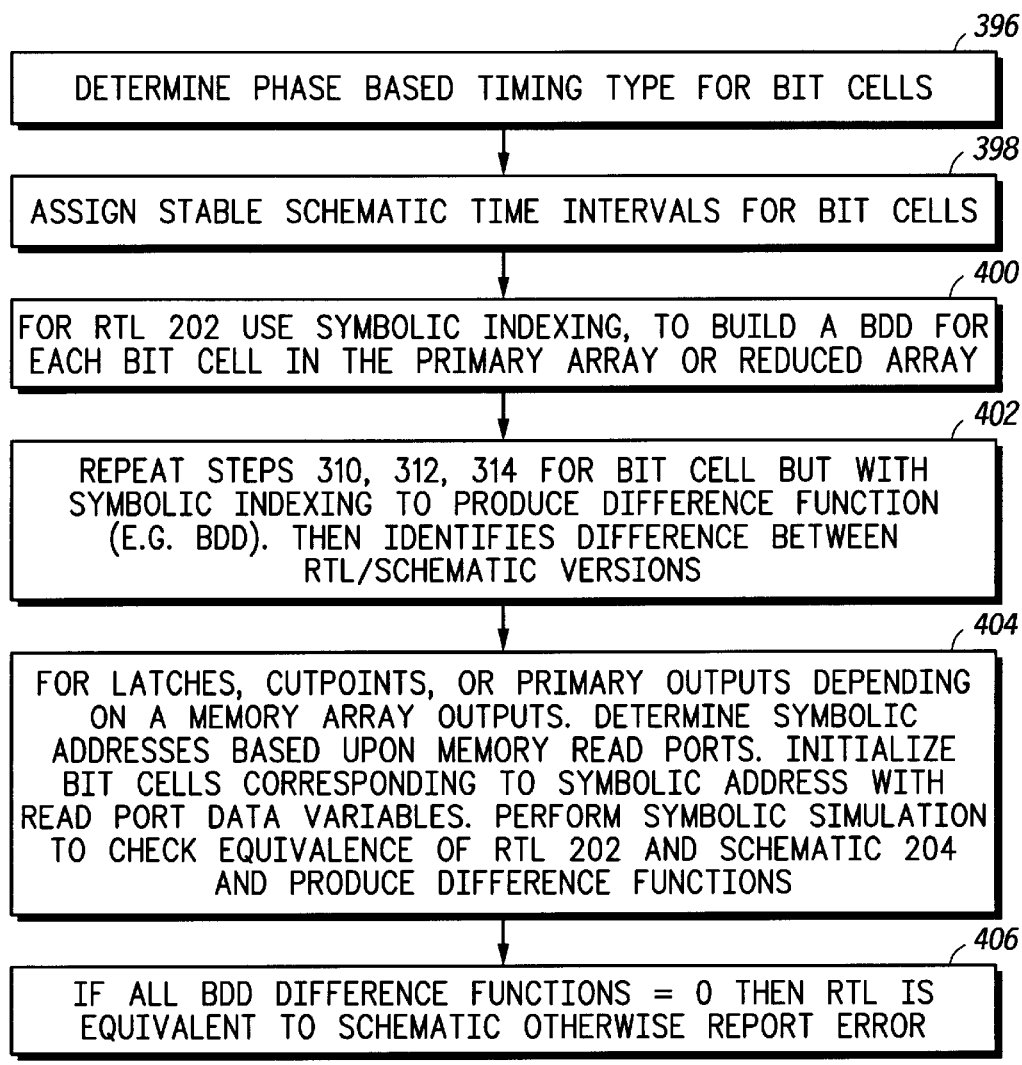
FIG. 4 is a flow diagram that illustrates a particular method of comparing different views of a portion of the design block of FIG. 1 for the memory array.

Referring to FIG. 4, a flow diagram is disclose d t hat illustrates a particular method of comparing different views of a portion of the design block of FIG. 1 for the memory array. Phase-based timing type s are determined for each bit cell in the memory array, or reduced memory array at 396. Stable schematic time intervals for each bit cell are assigned at 398. For the first view 202, symbolic indexing is used to build a symbolic function, e.g. BDD, for each bit cell in the memory array or a reduced memory array, at 400. A reduced memory array contains some but not all bit cells of a fully instantiated array. Due to the large size of certain fully instantiated arrays, verification of reduced memory arrays may be more design time efficient. A reduced memory array contains less bit cells than a fully instantiated memory array. The reduced memory array may have from a few bit cells to over one thousand bit cells.

At step 402, the previous steps 310, 312, and 314 from FIG. 3 are repeated for the bit cells, except that symbolic indexing is used, where after step 14 a bit cell difference symbolic function is produced. The bit cell difference symbolic function identifies differences between the bit cells of the first view 202 and the second view 204.

At step 404, for latches and cutpoints whose value depends on a memory array output, each array output is represented by a symbolic data variable when computing the consequent for the latch or cutpoint. When generating the antecedent, symbolic functions that represent the value of the read address for the memory are computed as would be done in step 308 for the hypothetical case in which the address signals had been designated as cutpoints. These functions are used as a symbolic index to initialize the bitcells with the symbolic data variable that represents the value of the memory array output.

For each circuit element from the first view 202 whose value is represented by a variable in the support of the symbolic functions that represent the value of the read address for the memory, an antecedent is generated. The circuit node name for the antecedent is the name of the circuit nod e from second view 204 that was identified at step 300 as corresponding to the circuit element from the first view 202. The time intervals and values of the antecedent are those that are given by the schematic time intervals identified in step 398 for the variable and the clock phase that the variable represents.

Figure 5:
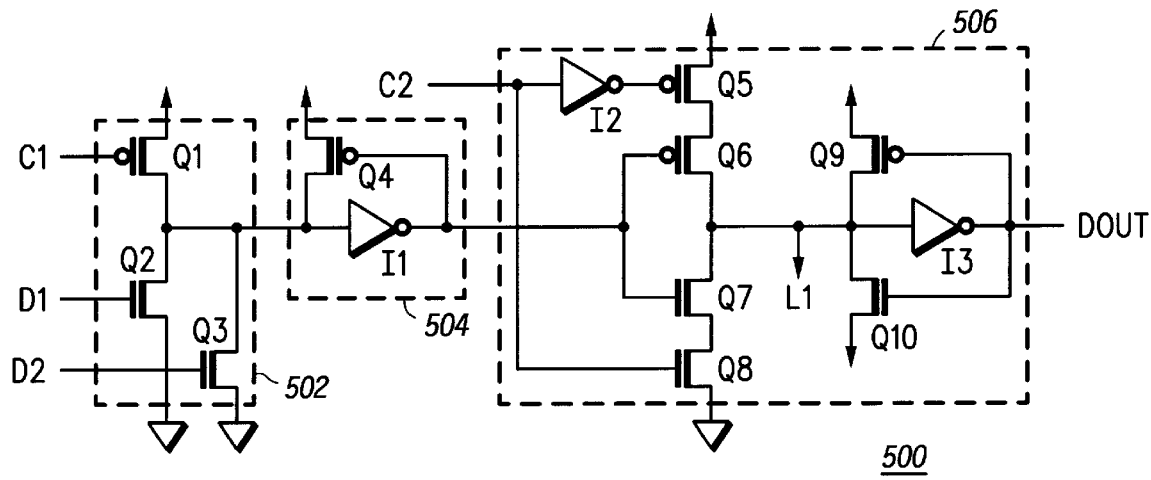
FIG. 5 is a schematic diagram that illustrates an exemplary design for a portion of a circuit.

FIG. 5 discloses a schematic diagram illustrating a circuit 500 where C1, C2, D1 and D2 are primary inputs to the circuit 500. The circuit 500 includes a dynamic "or" gate sub-circuit 502 including transistors Q1, Q2, Q3, a keeper sub-circuit 504 including transistor Q4 and inverter I1, and a latch sub-circuit 506 including transistors Q5, Q6, Q7, Q8, Q9, Q10 and inverters I2 and I3. It is critical for the correct operation of the circuit 500 that the primary inputs, D1, and D2 remain at logic 0 (ground potential) while the primary input C1 is at logic 0 (ground potential). It is also critical for the correct operation of the circuit 500 that the falling edge of the primary input C2 precedes the falling edge of the primary input C1.

A Verilog RTL representation of the circuit 500 of FIG. 5, for example, as simulated by a cycle simulator is shown as:

```
module example (C1, C2, D1, D2, Dout)
    input C1, C2, D1, D2;
    reg L1;
    output Dout;
    wire qin=C1 & (D1|D2);
    always @ (C2 or qin) if (C2) L1 <=qin;
    assign Dout=L1;
endmodule.
```

The primary inputs C1, C2, D1, D2, primary output Dout, and register L1, correspond to the primary inputs, primary outputs, and latch node of the circuit 500. The value stored in the latch represented by the schematic node L1 in the circuit 500 is the logical inverse of that stored by the register L1 in the Verilog representation of the circuit 500.

Figure 6:
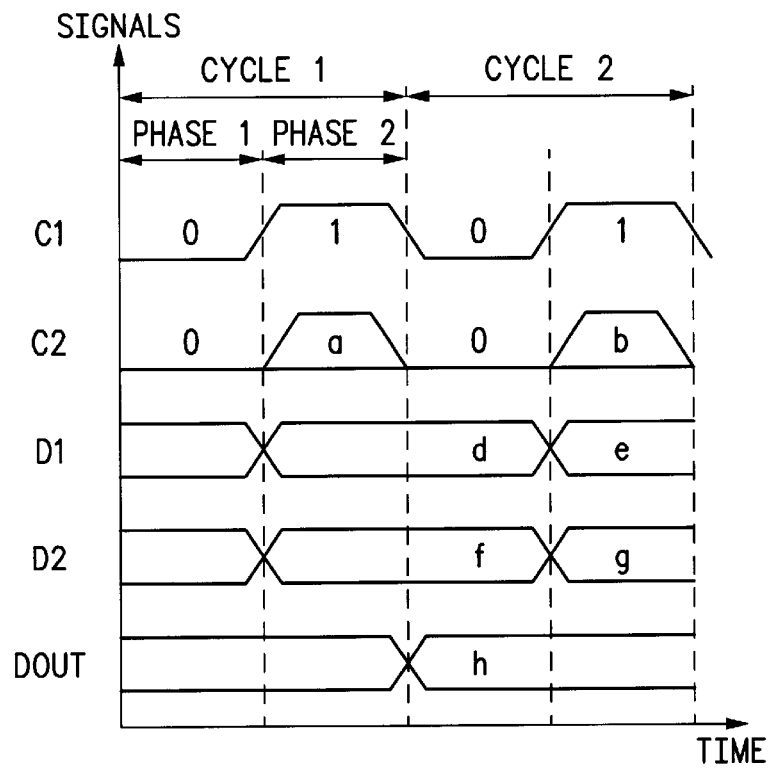
FIG. 6 is a digital wave form diagram that illustrates the phase-accurate timing of a Verilog representation of the circuit of FIG. 5.

In FIG. 6, a digital wave form diagram is disclosed that illustrates the phase-accurate timing of the Verilog representation of the circuit 500 such as would be produced by a cycle simulator. Both primary inputs C1 and C2 are always low during phase 1 of each cycle. The primary input C1 is always high during phase 2 of the cycle. The primary input C2 may be high or low during phase 2 of each cycle. The values of the primary inputs D1 and D2 may change between phase 1 and phase 2 of any given cycle. However, they will not change from phase 2 of one cycle, to phase 1 of the subsequent cycle. The value stored in the latch L1 may change only between phase 2 of one cycle, and phase 1 of the subsequent cycle. It remains constant throughout the two phases comprising any given cycle.

Figure 7:
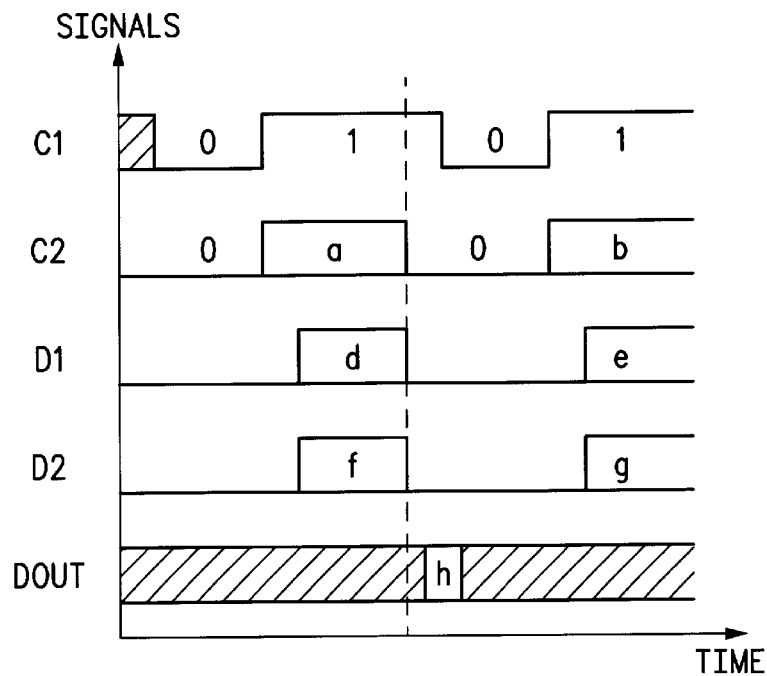
FIG. 7 is a digital wave form diagram that corresponds to the digital wave form diagram of FIG. 6.

In FIG. 7, a digital wave form diagram is disclosed corresponding to the digital wave form diagram of FIG. 6 and illustrating the timing of the signals of the circuit 500 as would be required for the event driven simulation. To facilitate comparison with the corresponding digital wave forms of FIG. 6 and FIG. 7, the values attained by input C2 in phase 2 of cycles 1 and 2 are shown as "a" and "b" respectively, the values attained by input D1 in phase 2 of cycles 1 and 2 are shown as "d" and "e" respectively, and the values attained by input D2 in phase 2 of cycles 1 and 2 are shown as "f" and "g" respectively. The data present in the digital wave form diagram of FIG. 7 is the data that is produced, for example, by step 306 in FIG. 3. The named signal values in FIG. 7 correspond to the named values disclosed in FIG. 6. The shaded areas correspond to values which are not significant. Those skilled in the art will recognize that the data is presented in FIG. 6 and FIG. 7 in diagrammatic form to aid the user in understanding the nature of the data required. Various other representations are possible and would be more practical for consumption by a computer program. For example, the timing for each signal in a given cycle could be represented simply by a list of pairs representing signal transitions, where the first element of each pair is an integer representing the time of the transition relative to the time of the start of the cycle, and the second element of the pair is a symbolic value representing the value of the signal after the transition has taken place.

Using the above illustrative method, a design module, such as design block 100, may be formally verified thereby providing increased confidence that the design will operate according to its specifications. Since the first design block view 202 can be simulated on a computer significantly faster than the second design block view 204, and since the second design block view 204 may be demonstrated to be a logical equivalent of the first design block view 202, a design block may be tested and debugged more quickly, leading to faster time to market for semiconductor devices manufactured in reliance upon the verified design block.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, where symbolic functions such as Boolean functions have been used, functions over any finite domain, such as ternary or quaternary functions could be used. These functions could have various representations, of which BDDs are one example. Symbolic assertions may also have various representations, such as, for example, the circuit node name, guard, value and time interval as disclosed or may include other representations. For example, while the first design block view 202 and the second design block view 204 were described with reference to the same design block 100, the method and technique are not limited to comparing different views of the same design. Rather, the illustrative method may be used to compare any data files having design representations. Therefore, it is intended that this invention encompass all of the variations and modifications as fall within the scope of the appended claims and equivalents thereof.

What is claimed is:

1. A verification system comprising:

a register transfer level representation of a design;

a circuit schematic representation of the design, the circuit schematic representation comprising at least one of logic gates or transistors, or both logic gates and transistors;

a plurality of design inputs;

a symbolic assertion generator wherein the plurality of design inputs and the register transfer level representation are used with schematic time intervals of the logic gates or transistors of the circuit schematic representation of the design for automated generation of assertions; and wherein said assertions are used for checking the equivalence between the register transfer level representation and the circuit schematic representation.

2. A verification system as recited in claim 1 wherein the design includes self-timed logic.

3. A verification system as recited in claim 1 wherein the design includes transparent latches.

4. A verification system as recited in claim 1 wherein the design includes an embedded memory array.

5. A verification system as recited in claim 1 wherein the assertions describe the behavior of the design over multiple time intervals.

6. A method for equivalence checking between an RTL view of a design and a schematic view of the design comprising:

identifying corresponding latches, primary inputs, primary outputs or cutpoints between the RTL view and the schematic view;

assigning stable schematic time intervals for the latches, the primary outputs or the cutpoints in the schematic view;

generating symbolic functions for a chosen set of the latches, the primary outputs or the cutpoints of the RTL view as a function of the primary inputs, the cutpoints or the latches from a prior clock phase;

combining the symbolic functions with the stable schematic time intervals to generate symbolic assertions; and performing symbolic simulation of the generated symbolic assertions on the schematic view for checking the equivalence with the RTL view and for producing difference functions.

7. A method for equivalence checking a design as recited in claim 6 wherein the stable schematic time intervals are transistor level timing parameters.

8. A method for equivalence checking as recited in claim 6 further comprising:

identifying user defined phase-based timing types for the primary inputs; and determining phase-based timing types for the latches, the primary outputs or the cutpoints.

9. A method for equivalence checking as recited in claim 6 wherein the step of performing symbolic simulation further includes the use of scalar values as a substitute for a subset of symbols.

10. A method for equivalence checking as recited in claim 6 wherein the symbolic functions are binary decision diagram Boolean functions.

11. A method for evaluating a design that includes a memory, the method comprising:

identifying corresponding bitcells of the memory between an RTL view and a schematic view of the design, the schematic view of the design having transistors or a combination of logic gates and transistors;

assigning stable time intervals for the bitcells in the schematic view;

automatically generating symbolic functions for a chosen set of the bitcells of the RTL view as a function of primary inputs, cutpoints, latches or bit cells of the design from a prior clock phase using symbolic indexing;

combining the symbolic functions with the stable time intervals to generate symbolic assertions; and performing symbolic simulation of the generated symbolic assertions on the schematic view for checking the equivalence with the first view.

12. The method for evaluating a design as recited in claim 11, further comprising:

automatically generating symbolic functions for bit cells, latches, cutpoints or primary outputs whose value depends on a memory output using a data variable to represent a value at the memory output and using the data variable for verifying the bit cells, latches, cutpoints or primary outputs which depend on said memory output; and generating symbolic functions for the memory read address and using the symbolic functions as a symbolic index to initialize the bit cells with the data variable.

13. The method for evaluating a design as recited in claim 12, further comprising:

performing symbolic simulation of the generated symbolic assertions on the schematic view for checking the equivalence with the RTL view.

14. A method for evaluating a design as recited in claim 12 wherein the memory output is a cutpoint.

15. A method for evaluating a design as recited in claim 11 further comprising:

identifying user defined phase-based timing types for the primary inputs; and determining phase-based timing types for the latches, primary outputs or the cutpoints.

16. A method for evaluating a design as recited in claim 11 wherein the bitcells are a part of a reduced memory array.

17. A method for evaluating a design as recited in claim 11 wherein the step of performing symbolic simulation further includes the use of scalar values as a substitute for a subset of symbols.

18. A method for evaluating a design as recited in claim 11 wherein the symbolic functions are binary decision diagram Boolean functions.

19. A method of comparing design block views comprising:

receiving a first design block view in RTL form;

receiving a second design block view in schematic level form comprising transistors and having been created without computer synthesis from the first design block view in RTL form, the second design block view containing data representing self-timed circuits;

using the data representing self-timed circuits and symbolic functions generated from the first design block view in RTL form to generate symbolic assertions; and comparing the first design block view in RTL form with the second design block view in schematic level form by performing symbolic simulation to determine whether the first design block view is logically equivalent to the second design block view.

20. A method of comparing design block views comprising:

receiving a register transfer level design block view;

receiving a transistor level design block view derived without computer generation using the register transfer level design block view, the second design block view containing transistor time interval data representative of at least one bit cell of a memory array; and comparing the register transfer level design block view with the transistor level design block view to perform equivalence checking and determine whether the first design block view is logically equivalent to the second design block view.

21. The method of claim 20, wherein the transistor time interval data is representative of a plurality of bit cells.

22. The method of claim 21, wherein the plurality of bit cells is greater than one thousand.

23. A method of processing data representing a design block, the method comprising:

receiving a first view of a design and schematic time intervals for the design; and generating, solely by computer automation and no manual computation, assertions produced with symbolic stimulus and expected results suitable for symbolic simulation based upon all timing and logic aspects of the first view, the assertions being generated by using design inputs comprising transistor timing parameters associated with the design.

24. The method of claim 23, wherein the assertions are used by a symbolic simulator and the design contains self-timed circuits.

* * * * *